United States Patent
Choy

(10) Patent No.: US 9,659,622 B1
(45) Date of Patent: May 23, 2017

(54) SENSE AMPLIFIER

(71) Applicant: FREESCALE SEMICONDUCTOR, INC., Austin, TX (US)

(72) Inventor: Jon S. Choy, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/003,922

(22) Filed: Jan. 22, 2016

(51) Int. Cl.
*G11C 11/00* (2006.01)
*G11C 11/16* (2006.01)

(52) U.S. Cl.
CPC ................................. *G11C 11/1673* (2013.01)

(58) Field of Classification Search
CPC ................................................ G11C 11/1673
USPC ....... 365/185.05, 185.21, 63, 129, 148, 154, 365/156, 158, 163, 189.011, 189.15, 365/189.07, 190, 202, 203, 210.1, 233.11, 365/242
See application file for complete search history.

(56) References Cited

U.S. PATENT DOCUMENTS

| | | | |
|---|---|---|---|
| 5,717,640 | A | 2/1998 | Hashimoto |
| 6,205,073 | B1 | 3/2001 | Naji |
| 6,396,733 | B1 | 5/2002 | Lu et al. |
| 6,674,679 | B1 | 1/2004 | Perner et al. |
| 6,816,403 | B1 | 11/2004 | Brennan et al. |
| 7,038,959 | B2 | 5/2006 | Garni |
| 7,319,606 | B2 | 1/2008 | Miyamoto |
| 8,363,457 | B2 | 1/2013 | Keshtbod |
| 9,378,781 | B1* | 6/2016 | Jung .................... G11C 7/08 |
| 9,390,779 | B2* | 7/2016 | Jung .................. G11C 11/1673 |
| 2013/0286721 | A1 | 10/2013 | Jung et al. |
| 2014/0056059 | A1 | 2/2014 | Mueller et al. |
| 2016/0300612 | A1 | 10/2016 | Manipatruni et al. |

OTHER PUBLICATIONS

Andre et al, "ST-MRAM Fundamentals, Challenges, and Applications", IEEE Custom Integrated Circuits Conference (CICC), Sep. 22-25, 2013, pp. 1-8.

Xu et al, "Design of Spin-Torque Transfer Magnetoresistive RAM and CAM/TCAM with High Sensing and Search Speed", IEEE Transaction on Very Large Scale Integration (VLSI) Systems, Jan. 2010, pp. 66-74.

Klostermann et al, "A Perpendicular Spin Torque Switching based MRAM for the 28 nm Technology Node", IEEE International Electron Devices Meeting, Dec. 10-12, 2007, pp. 187-190.

(Continued)

*Primary Examiner* — Fernando Hidalgo

(57) ABSTRACT

In a non-volatile memory, a method of performing a sensing operation to read a non-volatile (NV) element includes a first and a second phase. During the first phase, the NV element is coupled via a sense path transistor to a first capacitive element at a first input of an amplifier stage and a reference cell is coupled via a reference sense path transistor to a second capacitive element at a second input of the amplifier stage. During the second phase, the NV element is coupled via the sense path transistor to the second capacitive element and the reference cell is coupled via the reference sense path transistor to the first capacitive element. During the first phase, the first and second capacitive elements are initialized to voltages representative of states of the NV element and reference cell, respectively. During the second phase, the voltage differential between the two voltages is amplified.

12 Claims, 2 Drawing Sheets

(56) References Cited

OTHER PUBLICATIONS

Ohsawa et al, "A 1 Mb Nonvolatile Embedded Memory Using 4T2MTJ Cell With 32 b Fine-Grained Power Gating Scheme", IEEE Journal of Solid-State Circuits, Jun. 2013, pp. 1511-1520, vol. 48, No. 6.
U.S. Appl. No. 14/924,269, Morton, B. et al., "Sense Path Circuitry Suitable for Magnetic Tunnel Junction Memories", Office Action—Restriction, filed Oct. 27, 2015.
Non-Final Office Action for U.S. Appl. No. 14/924,269, Apr. 6, 2017, 18 pages.

\* cited by examiner

SENSE AMPLIFIER

BACKGROUND

Field

This disclosure relates generally to integrated circuit memories, and more particularly, to sense amplifiers that may be used in integrated circuit memories.

Related Art

Integrated circuit memories including non-volatile memories (NVMs) have become very important in a variety of applications. Some NVMs are not only non-volatile but have operating speeds near that of random access memories. Some of the resistive NVMs, such as magnetic tunnel junctions (MTJs) have this characteristic. Some of these resistive NVMs have other difficulties such as read disturb in which the memory cells can be written during a read operation. Voltages and currents can be very limited by the read disturb issue especially in the case where current is required to pass through the NVM cells that are being sensed in order to effectively perform a read. In such cases current must be sufficiently low to avoid read disturb while sufficiently large to generate a differential between programmed and erased states that can be reliably detected Accordingly there is a need to provide further improvement in obtaining NVRAMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

Shown in FIG. 1 is a circuit diagram of a sense amplifier for use in a memory, and particularly suited to NVMs using MTJs; and Shown in FIG. 2 is a timing diagram helpful in understanding the operation of the sense amplifier of FIG. 1.

DETAILED DESCRIPTION

In one aspect, a sense amplifier provides a first differential signal to a sense amplifier on a differential pair during a first phase and then increases the differential during a second phase by reversing the inputs to the sense amplifier. This is better understood by reference to the drawings and the following written description.

Figure 1:
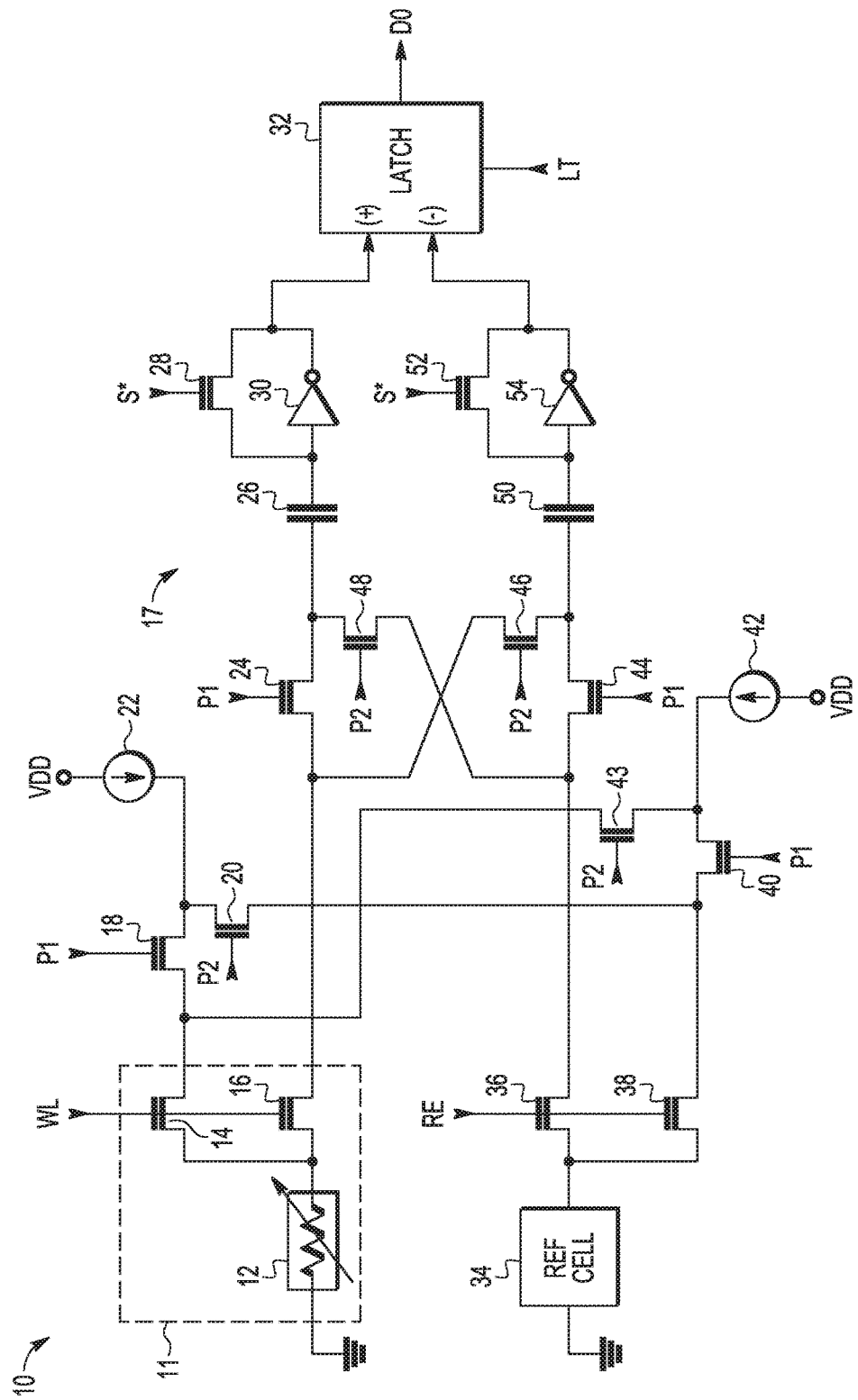

Shown in FIG. 1 is non-volatile memory (NVM) circuitry 10 having an NVM cell 11 and a sense amplifier 17. NVM cell 11 has an NV element 12 that may be a magnetic tunnel junction (MTJ), a transistor 14, and a transistor 16. NV element 12 has a first terminal connected to a negative power supply terminal that may be ground and a second terminal. Transistor 14 has a first current electrode connected to the second terminal of NV element 12, a control electrode connected to a word line WL, and a second current electrode. Transistor 16 has a first current electrode connected to the first current electrode of transistor 14 and the second terminal of NV element 12, a control electrode connected to word line WL, and a second current electrode. Sense amplifier 17 has a transistor 18, a transistor 20, a current source 22, a transistor 24, a capacitor 26, a transistor 28, an inverting amplifier 30, a latch 32, a reference cell 34, a transistor 36, a transistor 38, a transistor 40, a current source 42, a transistor 44, a capacitor 50, a transistor 52, and an inverting amplifier 54.

Transistor 18 has a first current electrode connected to the second current electrode of transistor 14, a control electrode for receiving a first phase signal P1, and a second current electrode. Transistor 20 has a first current electrode connected to the second current electrode of transistor 18, a control electrode for receiving a second phase signal P2, and a second current electrode. Current source 22 has an output terminal connected to the second current electrode of transistor 18 and an input connected of a positive power supply terminal which may be VDD. Transistor 24 has a first current electrode connected to the second current electrode of transistor 16, a control electrode for receiving first phase signal P1, and a second current electrode. Capacitor 26 has a first terminal connected to the second current electrode of transistor 24 and a second current electrode. Transistor 28 has a first current electrode connected to the second current electrode of capacitor 26, a control electrode for receiving a sensing signal S* that is a logic low when sensing is occurring, and a second current electrode. Inverting amplifier 30 has an input connected to the first current electrode of transistor 28 and an output connected to the second current electrode of transistor 28. Latch 32 has a non-inverting input (+) connected to the output of inverting amplifier 30; an inverting input; a latch input for receiving latch signal LT, and a data output DO. Reference cell 34 has a first terminal connected to the negative power supply terminal and second terminal. Transistor 36 has a first current electrode connected to the second terminal of reference cell 34, a control electrode for receiving a reference enable signal RE, and a second current electrode. Transistor 38 has a first current electrode connected to the second terminal of reference cell 34, a control electrode for receiving reference enable signal RE, and a second current electrode. Transistor 40 has a first current electrode connected to the second current electrode of transistor 38 and the second current electrode of transistor 20, a control electrode for receiving first phase signal P1, and a second current electrode. Current source 42 has an output connected to the second current electrode of transistor 40 and an input connected to the positive power supply terminal. Transistor 43 has a first current electrode connected to the second current electrode of transistor 40, a control electrode for receiving second phase signal P2, and a second current electrode connected to the second current electrode of transistor 14. Transistor 44 has a first current electrode connected to the second current electrode of transistor 36, a gate for receiving first phase signal P1, and a second current electrode. Transistor 46 has a first current electrode connected to the second current electrode of transistor 44, a control electrode for receiving second phase signal P2, and a second current electrode connected to the second current electrode of transistor 16. Transistor 48 has a first current electrode connected to the second current electrode of transistor 36, a control electrode for receiving second phase signal P2, and a second current electrode connected to the second current electrode of transistor 24. Capacitor 50 has a first terminal connected to the second current electrode of transistor 44 and a second terminal. Transistor 52 has a first current electrode connected to the second terminal of capacitor 50, a control electrode for receiving a sensing signal S* that is a logic low when sensing is occurring, and a second current electrode. Inverting amplifier 54 has an input connected to the first current electrode of transistor 52 and an output connected to the second current electrode of transistor 52 and to the inverting input (−) of latch 32.

Reference cell 34 is designed to have a resistance halfway between the high resistance state and low resistance state of NV elements such as NV element 12. This can be achieved by having a first pair of NV elements, connected in series, of opposite resistances that are connected in parallel with a second pair of NV elements, connected in series, of opposite resistances.

Figure 2:
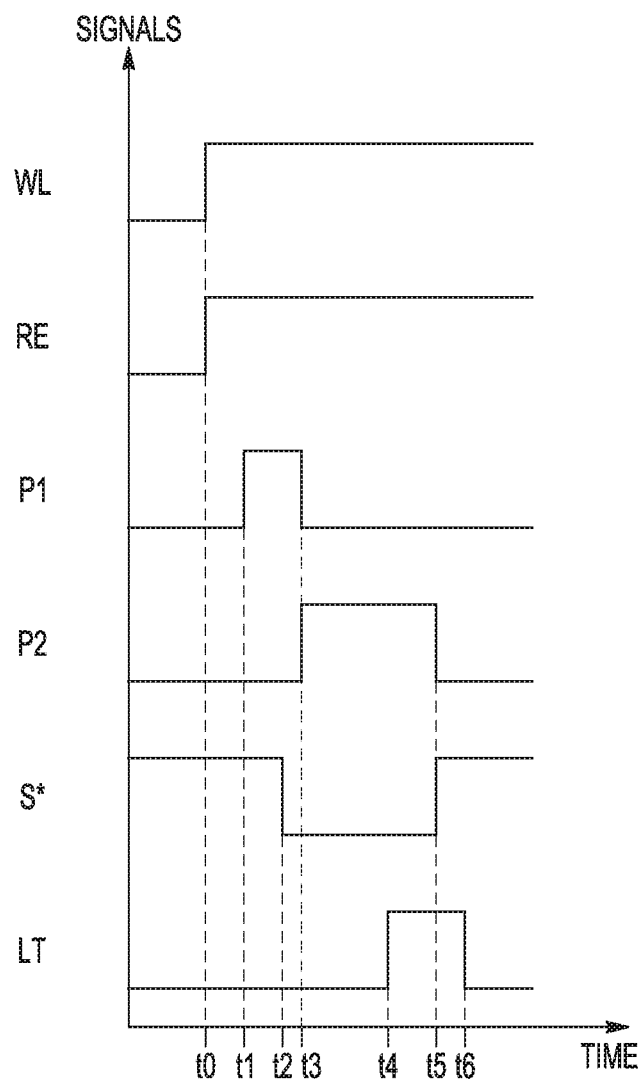

Shown in FIG. 2 is a timing diagram showing a read of NV element 12 beginning at a time t0 resulting in latch 32 providing an output DO in response to latch signal LT at a time t4 and ending at a time t6. Immediately prior to time t0, word line WL, reference enable signal RE, first phase signal P1 and second phase signal P2 are a logic low so that transistors 14, 16, 18, 20, 24, 36, 38, 40, 43, 44, 46, and 48 are non-conductive; latch signal LT is a logic low so that latch 32 is disabled and output signal DO is not valid; and sensing signal S* is a logic high so that transistors 28 and 52 are conductive but sensing is not occurring in this condition. In this condition, inverting amplifiers 30 and 54 having their inputs coupled to their outputs so that inverting amplifiers 30 and 54 are at their trip point at which they are in an indeterminate state between a logic high and a logic low.

At time t0, word line WL and reference enable signals switch to a logic high which causes transistors 14, 16, 36 and 38 to become conductive. The second current electrodes of transistors 18 and 24 are thereby coupled to NV element 12, and the second current electrodes of transistors 40 and 44 are coupled to reference cell 34. This is the beginning of a read operation.

At a time t1, first phase signal P1 switches to a logic high which causes transistors 18, 24, 40 and 44 to become conductive and result in the switch to the first phase. At the commencement of the first phase, current from current source 22 then flows through transistors 18 and 14 and NV element 12 which has the effect of a voltage representative of the logic state of NV element being coupled through transistors 16 and 24 to the first terminal of capacitor 26. Similarly, current from current source 42 flows through transistors 40 and 38 and reference 34 which has the effect of a reference voltage being provided to the first terminal of capacitor 50 in which the reference voltage is about halfway between the voltage provided by an NV element that has been programmed to a logic high and an NV element that has been programmed to a logic low. Assuming a high resistance of NV element 12 is a logic high and a low resistance is a logic low, a higher voltage on the first terminal of capacitor 26 than on the first terminal of capacitor 50 indicates that NV element 12 has been programmed to a logic high. If a lower voltage were on the second terminal of capacitor 26 than on the second terminal of capacitor 50, then NV element 12 would have been programmed to a logic low. The inputs of inverting amplifiers 30 and 54 are unaffected at this point due to transistors 28 and 52 coupling the inputs to the outputs. For this example of NV element 12 being a logic low, the first terminal of capacitor 26 will have a voltage difference of V1+ over the reference voltage at the first terminal of capacitor 50.

At a time t2, very close in time to a time t3, sensing signal S* switches to a logic low causing transistors 28 and 52 to be non-conductive which has the effect of inverting amplifiers 30 and 54 no longer having their outputs coupled back to their inputs so that inverting amplifiers become sensitive to changes on the first terminals of capacitors 26 and 54.

At a time t3, first phase signal P1 switches to a logic low and second phase signal P2 switches to a logic high so that transistors 18, 24, 40, and 44 become non-conductive and transistors 20, 43, 46, and 48 become conductive which commences the switch from the first phase to the second phase. With transistor 43 being conductive and transistor 18 non-conductive, current from current source 42 passes through NV element 12. Although current sources 22 and 42 are designed to be identical, in practice they do not provide identical currents. The current differential results in a deviation from the desired relationship between a reference voltage and the voltage provided from the NV element being read. Switching the current sources between the reference cell and the NV element being read reduces this undesired deviation from the desired relationship. With transistor 24 non-conductive and transistor 46 conductive, the voltage resulting from current through NV element 12 is coupled to the first terminal of capacitor 50. Similarly, with transistor 44 non-conductive and transistor 48 conductive, the voltage resulting from reference cell 34 is coupled to the first terminal of capacitor 26. Inverting amplifiers 30 and 54 are now actively sensing. In the case of inverting amplifier 30, there is capacitive coupling through capacitor 26 of the change from voltage difference V1+ to the reference voltage which is a negative voltage change reducing the input of inverting amplifier 30 below the switch point. In the case of inverting amplifier 54, which has analogous operation, the voltage on the first terminal of capacitor 50 is going from the reference voltage, which now results from current from current source 22 passing through reference cell 34, to the voltage resulting from NV element 12 being a logic high. With current sources 22 and 42 being switched, the reference voltage and the logic high voltage will have a similar differential to the voltage difference V1+ resulting from the time period first phase signal P1 was a logic high. In the case of inverting amplifier 30, it provides a logic high output due to the voltage drop of the first terminal of capacitor 26 after inverting amplifier 30 became active. In the case of inverting amplifier 54, it provides a logic low output due to the voltage drop of the first terminal of capacitor 50 after inverting amplifier 54 became active.

At time t4, latch signal LT switches to a logic high causing latch 32 to respond to the logic states of its inputs which results in latch 32 providing output signal DO as a logic high. The output of latch 32 is then the output representative of the logic state of NV element 12.

At a time t5, second phase signal P2 switches to a logic low and sense signal S* switches to a logic high. At time t5 then circuitry 10 is returned to its state, except for latch 32, that it was in prior to time t0.

At a time t6, latch signal LT returns to a logic low and latch 32 is then also in its condition prior to time t0. Latch signal LT returning to a logic low results in output signal DO not being latched and may not be providing valid data.

For the case of the NV element 12 being programmed to a logic low, its low resistance would result in a voltage that is below the reference voltage on the first terminal of capacitor 26 which could be considered to be a voltage V1− below the reference voltage. The subsequent redirecting of the current sources, the voltage from the reference cell, and the voltage from NV element, would result in reducing the voltage on the input of inverting amplifier 30 causing a logic low output and in increasing the voltage on the input of inverting amplifier 54 causing a logic high output. When latch signal LT switched to a logic high, latch 32 would provide a logic low output representative of the logic low condition of NV element 12.

By having a true differential, not just comparing a signal to a reference, the difference between input signals is increased for a given cell current which is desirably low due to needing to avoid read disturb with a high degree of certainty. Accordingly, doubling the voltage differential being sensed allows for a lower current to be used to develop the voltage used in sensing. Reducing the current increases the risk of read disturb. The current supplied to the NV element being sensed may be considering a forcing current due to it be used to force a voltage for sensing. The forcing current in the case of first phase signal P1 being applied as a logic high to transistor 14 is through transistor 14 so transistor 14 may be considered a force path transistor because it provides a current path which results in forcing NV element 12 to develop a voltage relative to its logic state. The current comes to transistor 14 at its second current electrode through a force node which receives current from either current source 22 or current source 42. Transistor 16 couples this voltage relative to the logic state of NV element 12 out from NV element for the purpose of sensing to a sense node. Either transistor 24 or transistor 46 couples the sense node to the selected capacitive element, capacitor 26 or capacitor 50, respectively. Accordingly transistor 16 may be considered a sense path transistor. The analogous current for the reference, reference cell 34, passes through transistor 38 and may be referenced as a reference current passing through reference force path transistor 38 coupled to a reference force path. Similar to transistor 16, transistor 36 may be referenced as a reference sense path transistor coupled to a reference sense node. The first phase establishes a voltage differential that is increased to about double in the second phase.

By now it should be appreciated that there has been disclosed non-volatile memory (NVM) circuitry having a non-volatile (NV) element coupled to a first current electrode of a force path transistor and to a first current electrode of a sense path transistor, wherein a second current electrode of the force path transistor is coupled to a first force node and a second current electrode of the sense path transistor is coupled to a first sense node. The NVM circuitry further includes a reference cell coupled to a first current electrode of a reference force path transistor and to a first current electrode of a reference sense path transistor, wherein a second current electrode of the reference force path transistor is coupled a second force node and a second current electrode of the reference sense path transistor is coupled to a second sense node. The NVM circuitry further includes a first capacitive element having a first electrode and having a second electrode coupled to a first input of an amplifier stage. The NVM circuitry further includes a second capacitive element having a first electrode and having a second electrode coupled to a second input of the amplifier stage. The NVM circuitry is characterized by which the NVM circuitry is configured to, during a first phase of a sensing operation, couple the first sense node to the first electrode of the first capacitive element and couple the second sense node to the first electrode of the second capacitive element, and during a second phase of the sensing operation, couple the first sense node to the first electrode of the second capacitive element and couple the second sense node to the first electrode of the first capacitive element. The NVM circuitry may have a further characterization by which the first phase is configured to initialize the first current electrode of the first capacitive element to a voltage representative of a memory state of the NV element and initialize the first current electrode of the second capacitive element to a reference voltage representative of a reference state of the reference cell. The NVM circuitry may have a further characterization by which the second phase is configured to amplify a voltage differential between the voltage representative of the memory state and the reference voltage representative of the reference state. The NVM circuitry may have a further characterization by which the NVM circuitry is configured such that sensing by the amplifier stage for the sensing operation is commenced prior to commencement of the second phase. The NVM circuitry may further include a first current source and a second current source, wherein the NVM circuitry is configured to, during the first phase, couple the first current source to the first force node and coupled the second current source to the second force node. The NVM circuitry may have a further characterization by which the NVM circuitry is configured to, during the second phase, couple the first current source to the second force node and couple the second current source to the first force node. The NVM circuitry may have a further characterization by which, during the second phase, the NVM circuitry is configured to reduce differences in the first and second current sources. The NVM circuitry may have a further characterization by which the NV element comprises a first resistive element. The NVM circuitry may have a further characterization by which the first resistive element is characterized as a magnetic tunnel junction (MTJ). The NVM circuitry may have a further characterization by which the reference cell comprises a second resistive element having a resistance between a high resistance state and a low resistance state of the first resistive element.

Also disclosed is, in an NVM, a method of performing a sensing operation to read an NV element including, during a first phase, coupling the NV element via a sense path transistor to a first capacitive element at a first input of an amplifier stage and coupling a reference cell via a reference sense path transistor to a second capacitive element at a second input of the amplifier stage. The method also includes, during a second phase, subsequent the first phase, coupling the NV element via the sense path transistor to the second capacitive element and coupling the reference cell via the reference sense path transistor to the first capacitive element. The method may further include, during the first phase, providing a first current via a force path transistor to the NV element and providing a second current via a reference force path transistor to the reference cell, and, during the second phase, providing the first current via the reference force path transistor to the reference cell and providing the second current via the force path transistor to the NV element. The method may have a further characterization by which, prior to commencement of the second phase, enabling sensing by the amplifier stage. The method may further include outputting a logic state of the NV element in response to enabling sensing by the amplifier stage. The method may have a further characterization by which, during the first phase, the first capacitive element is initialized to a voltage representative of a memory state of the NV element and the second capacitive element is initialized to a reference voltage representative of a reference state of the reference cell. The method may have a further characterization by which, during the second phase, the voltage differential between the voltage representative of the memory state and the reference voltage representative of the reference state is amplified. The method may have a further characterization by which the NV element is characterized as a magnetic tunnel junction (MTJ).

Disclosed also is NVM circuitry including a non-volatile (NV) element. The NVM circuitry further includes a first transistor coupled between the NV element and a first sense node. The NVM circuitry further includes a reference cell. The NVM circuitry further includes a second transistor coupled between the reference cell and a second sense node. The NVM circuitry further includes a first switch coupled between the first sense node and a first capacitive element at a first input of an amplifier stage. The NVM circuitry further includes a second switch coupled between the second sense node and a second capacitive element at a second input of the amplifier stage. The NVM circuitry further includes a third switch coupled between the first sense node and the second capacitive element. The NVM circuitry further includes a fourth switch coupled between the second sense node and the first capacitive element. The NVM circuitry has a further characterization by which the first and second switches are configured to, during a first phase of a sensing operation, couple the first sense node to the first capacitive element and couple the second sense node to the second capacitive element and the third and fourth switches are configured to, during a second phase of the sensing operation, couple the first sense node to the second capacitive element and couple the second sense node to the first capacitive element. The NVM circuitry may further include a third transistor coupled between the NV element and a first force node, a fourth transistor coupled between the reference cell and a second force node, a first current source, a second current source, a fifth switch coupled between the third transistor and the first current source, a sixth switch coupled between the fourth transistor and the second current source, a seventh switch coupled between the first current source and the fourth transistor, and an eighth switch coupled between the second current source and the third transistor, in which the fifth and sixth switches are configured to, during the first phase, couple the first current source to the third transistor and couple the second current source to the fourth transistor and the seventh and eighth switches are configured to, during the second phase, couple the first current source to the fourth transistor and couple the second current source to the third transistor. The NVM circuitry may have a further characterization by which the NVM circuitry is configured such that sensing by the amplifier stage for the sensing operation is commenced prior to commencement of the second phase.

Although the invention is described herein with reference to specific embodiments, various modifications and changes can be made without departing from the scope of the present invention as set forth in the claims below. For example, the power supply voltage coupled to the NV element may be a different voltage and one or more of the transistors may be of a different type. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. Non-volatile memory (NVM) circuitry comprising:
    a non-volatile (NV) element coupled to a first current electrode of a force path transistor and to a first current electrode of a sense path transistor, wherein a second current electrode of the force path transistor is coupled to a first force node and a second current electrode of the sense path transistor is coupled to a first sense node;
    a reference cell coupled to a first current electrode of a reference force path transistor and to a first current electrode of a reference sense path transistor, wherein a second current electrode of the reference force path transistor is coupled a second force node and a second current electrode of the reference sense path transistor is coupled to a second sense node;
    a first capacitive element having a first electrode and having a second electrode coupled to a first input of an amplifier stage; and
    a second capacitive element having a first electrode and having a second electrode coupled to a second input of the amplifier stage,
    wherein the NVM circuitry is configured to, during a first phase of a sensing operation, couple the first sense node to the first electrode of the first capacitive element and couple the second sense node to the first electrode of the second capacitive element, and during a second phase of the sensing operation, couple the first sense node to the first electrode of the second capacitive element and couple the second sense node to the first electrode of the first capacitive element.

2. The NVM circuitry of claim 1, wherein the first phase is configured to initialize the first current electrode of the first capacitive element to a voltage representative of a memory state of the NV element and initialize the first current electrode of the second capacitive element to a reference voltage representative of a reference state of the reference cell.

3. The NVM circuitry of claim 2, wherein the second phase is configured to amplify a voltage differential between the voltage representative of the memory state and the reference voltage representative of the reference state.

4. The NVM circuitry of claim 3, wherein the NVM circuitry is configured such that sensing by the amplifier stage for the sensing operation is commenced prior to commencement of the second phase.

5. The NVM circuitry of claim 1, further comprising:
    a first current source; and
    a second current source, wherein the NVM circuitry is configured to, during the first phase, couple the first current source to the first force node and coupled the second current source to the second force node.

6. The NVM circuitry of claim 5, wherein the NVM circuitry is configured to, during the second phase, couple the first current source to the second force node and couple the second current source to the first force node.

7. The NVM circuitry of claim 6, wherein during the second phase, the NVM circuitry is configured to reduce differences in the first and second current sources.

8. The NVM circuitry of claim 1, wherein the NV element comprises a first resistive element.

9. The NVM circuitry of claim 8, wherein the first resistive element is characterized as a magnetic tunnel junction (MTJ).

10. The NVM circuitry of claim 8, wherein the reference cell comprises a second resistive element having a resistance between a high resistance state and a low resistance state of the first resistive element.

11. NVM circuitry comprising: a non-volatile (NV) element;
- a first transistor coupled between the NV element and a first sense node;
- a reference cell;
- a second transistor coupled between the reference cell and a second sense node;
- a third transistor coupled between the NV element and a first force node;
- a fourth transistor coupled between the reference cell and a second force node;
- a first current source;
- a second current source;
- a first switch coupled between the first sense node and a first capacitive element at a first input of an amplifier stage;
- a second switch coupled between the second sense node and a second capacitive element at a second input of the amplifier stage;
- a third switch coupled between the first sense node and the second capacitive element;
- a fourth switch coupled between the second sense node and the first capacitive element
- a fifth switch coupled between the third transistor and the first current source;
- a sixth switch coupled between the fourth transistor and the second current source;
- a seventh switch coupled between the first current source and the fourth transistor; and
- an eighth switch coupled between the second current source and the third transistor, wherein:
- the first and second switches are configured to, during a first phase of a sensing operation, couple the first sense node to the first capacitive element and couple the second sense node to the second capacitive element,
- the third and fourth switches are configured to, during a second phase of the sensing operation, couple the first sense node to the second capacitive element and couple the second sense node to the first capacitive element,
- the fifth and sixth switches are configured to, during the first phase, couple the first current source to the third transistor and couple the second current source to the fourth transistor, and
- the seventh and eighth switches are configured to, during the second phase, couple the first current source to the fourth transistor and couple the second current source to the third transistor.

12. The NVM circuitry of claim 11, wherein the NVM circuitry is configured such that sensing by the amplifier stage for the sensing operation is commenced prior to commencement of the second phase.

* * * * *